US006984996B2

(12) United States Patent
DiOrio et al.

(10) Patent No.: US 6,984,996 B2
(45) Date of Patent: *Jan. 10, 2006

(54) WAFER PROBING THAT CONDITIONS DEVICES FOR FLIP-CHIP BONDING

(75) Inventors: Mark L. DiOrio, Cupertino, CA (US); Robert M. Hilton, Queensland (AU)

(73) Assignee: Celerity Research, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/428,572

(22) Filed: May 1, 2003

(65) Prior Publication Data

US 2004/0217767 A1 Nov. 4, 2004

(51) Int. Cl.
*G01R 31/02* (2006.01)

(52) U.S. Cl. ........................ 324/754; 324/755; 324/761

(58) Field of Classification Search ................. 324/755, 324/765, 158.1, 761, 754; 257/48, 737; 29/840, 29/852, 863; 439/482, 700; 438/14, 17, 18
See application file for complete search history.

(56) References Cited

U.S. PATENT DOCUMENTS 5,055,778 A * 10/1991 Okubo et al. ............... 324/754
5,513,430 A 5/1996 Yanof et al.
5,604,446 A * 2/1997 Sano .......................... 324/758
5,642,056 A 6/1997 Nakajima et al.
5,804,983 A 9/1998 Nakajima et al.
5,828,225 A 10/1998 Obikane et al.
6,075,373 A 6/2000 Iino
6,359,456 B1 3/2002 Hembree et al.
6,426,636 B1 7/2002 Das et al.
6,426,637 B1 7/2002 Dang et al.
6,426,639 B2 * 7/2002 Farnworth et al. .......... 324/755
6,552,555 B1 4/2003 Nuytkens et al.
6,621,710 B1 9/2003 Cheng et al.

* cited by examiner

*Primary Examiner*—Vinh Nguyen
*Assistant Examiner*—Jimmy Nguyen
(74) *Attorney, Agent, or Firm*—David T. Millers

(57) ABSTRACT

A probing system or process for electrical testing of a device fabricated on a wafer also conditions terminals such as solder balls on the device to improve uniformity of the heights of the terminals and improve the reliability of connections to an interconnect substrate in a flip-chip package or to a printed circuit board in a chip-on-board application. The system can employ a probe card that is a printed circuit board and/or is substantially identical to interconnect substrates used in flip-chip packaging. The probe card can be replaceable on a test head to allow for quick changes the reduce ATE downtime and to accommodate device changes such as a die shrink. Probe tips on the probe card can be the contact pads or bumps that are the normal electrical contact structures of the interconnect substrates.

10 Claims, 6 Drawing Sheets

WAFER PROBING THAT CONDITIONS DEVICES FOR FLIP-CHIP BONDING

BACKGROUND

Testing of integrated circuit identifies devices that are defective and also provides information regarding the yield of or problems in the fabrication process. Preferably testing is preformed early in the fabrication process to avoid wasted processing of defected parts and to identify process problems before a correctable problem affect multiple batches. Wafer probing in particular permits early electrical testing of integrated circuit devices before the devices are separated from a wafer. The devices identified as being defective or bad can then be discarded before being packaged. Further, corrections or adjustments to the fabrication process can be made without the additional delay that would result if devices were only tested after being packaged.

FIG. 1 illustrates conventional test equipment 100 for the testing of an integrated circuit device 112 fabricated on a wafer 110. Wafer 110 generally is a semiconductor wafer that includes multiple devices 112. For testing, a prober or other positioning system (not shown) moves wafer 110 or a test head 130 to align a test board 120 with the device 112 currently selected for testing. On test board 120 are pins 124 arranged to match the pattern of electrical terminals 114 on each device 112. When test board 120 is appropriately aligned with the selected device 112, pins 124 and terminals 114 are brought together to provide electrical connections between the selected device 112 and test board 120. Pins 124, test board 120, and test head 130 can then relay electrical signals between the selected device 112 and test electronics 140.

Test equipment 100 is generally designed to avoid or minimize damage to devices 112, particularly where pins 124 contact terminals 114. In FIG. 1, pins 124 are cantilevered to provide flexibility that limits the force that pins 124 apply to terminals 114. Some other similar test equipment designs use spring-loaded pins that similarly cushion or limit the force applied to devices 112 during testing.

A disadvantage of pins 124 being flexible is the ease with which pins 124 become misaligned. When one of pins 124 is bent, for example, during cleaning or use, that pin 124 will often fail to make a good electrical contact with the target terminal 114, resulting in a failed test. Further, a difference in the thermal properties of wafer 110 and test board 120 or pins 124 limits the temperature range at which pins 124 will suitably match the pattern of terminals 114. Particularly, pins 124 are long relative to the size of device 112 and will proportionally change in length when the temperature changes.

Damage or abrasion that testing causes on terminals 114 can be a problem even when pins 124 are compliant, and such damage is particularly problematic when device 112 is designed for flip-chip packaging. FIG. 2 illustrates a flip-chip package 200 including a die 210 and an interconnect substrate 220. Die 210 contains a device 112 that has been separated from wafer 110 of FIG. 1. Flip-chip packaging attaches metal bumps, which form elevated electrical terminals 114 on device 112, to pads 224 on substrate 220. Interconnect substrate 220 then provides electrical connections between die 210 and external terminals 222.

Sharp test pins 124 that contact terminals 114 before the packaging process can leave gouges 216 in metal bumps 114, particularly when the contacted portion of the metal bumps are relatively soft metal such as solder. Gouges 216 can trap contaminants such as oxidation or soldering flux that weaken solder joints between terminals 114 and pads 214, resulting in a less dependable package.

Another potential problem in flip-chip packages arises from non-uniformity terminals 114. In particular, for a reliable attachment of terminals 114 to pads 214, the tops of terminals 114 and pads 214 should lie in a plane corresponding to the packaging substrate. FIG. 2 illustrates the problem of a terminal 114' that fails to extend to or make a reliable connection with a corresponding pad 214. The formation process for terminals 114 would typically be the cause of non-uniform terminals 114, but pins 124 can abrade selected terminals 114 during testing and further disrupt planarity, making reliable packaging more difficult.

SUMMARY

In accordance with an aspect of the invention, a wafer probing process improves planarity or otherwise conditions the tops of metal bumps that form the electrical terminals of a semiconductor device. The probing process can thus electrically test devices and flatten or condition terminals of the device to aid in the formation of reliable bonds between the device and a packaging substrate during flip-chip packaging.

In accordance with another aspect of the invention, a wafer probe for a device that is designed for flip-chip packaging uses a probe card that is substantially identical to an interconnect substrate that will form part of the packaged device. In one configuration, the probe card has a compliant mounting to cushion the contact force on the terminals of integrated circuits under test. Alternatively, a non-compliant mounting holds the probe card during testing. Using an interconnect substrate suitable for flip-chip packaging as the probe card for wafer probing reduces the cost of preparing the probe card. The probe card additionally provides durable alignment for testing of integrated circuits and does not require realignment for testing of the integrated circuit when the wafer (and the test board) are at an elevated temperature.

One specific embodiment of the invention is a wafer probing system that includes a tester, a probe card, and a prober. The tester is electrically connected to the probe card, and the prober controls the relative position of a wafer and the probe card so that probe tips on the probe card contact terminals on the wafer. In accordance with an aspect of the invention, the probe tips have flat contact surfaces or contact surfaces shaped to condition the terminals for subsequent flip-chip packaging.

The probe tips are generally non-compliant and can be mounted on a test head using either a compliant or non-compliant mounting. In either case, the probe tips can be used to flatten individual terminals and improve overall planarity of the terminals of a device. The improved planarity in turn improves the integrity of interconnect joints if the device is subsequently packaged in a flip-chip package.

The probe card can be a printed circuit board (PCB) or an interconnect card suitable for flip-chip packaging of the device being tested. For these types of probe cards, the probe tips can be contact pads of the PCB or interconnect card or can be contact bumps on the PCB or interconnect card.

Preferably, each probe tip has a flat area with a width that is at least half as wide as the corresponding terminal. To permit probing at different temperatures, the probe tips may have sizes that depend on distances from a center point of the terminal pattern so that the probe tips can be aligned to contact the terminals on the wafer despite differential thermal expansion of the probe card relative to the wafer.

Another specific embodiment of the invention is a probe card for electrical testing of a device. The probe card includes a first substrate adapted for mounting on test equipment, a receptacle mounted on the first substrate, and a second substrate in the receptacle. The second substrate, which can be an interconnect substrate suitable for a flip-chip package containing the device, includes probe tips in a pattern that matches a pattern of terminals on the device. The receptacle generally permits quick replacement of the second substrate with a third substrate having probe tips in a pattern that is the same or different from the pattern of probe tips on the second substrate.

Yet another specific embodiment of the invention is a process that includes: bringing probe tips into contact with terminals on a devices; using the probe tips to deform the terminals to improve planarity of the terminals; and electrically testing the device through electrical connections of the probe tip to the terminals. For the desired electrical contact and deformations, each probe tip can use a flat area to contact and flatten a corresponding one of the terminals.

The probe tips are generally non-compliant and can be the bumped or unbumped contact pads of a substrate such as a printed circuit board or an interconnect substrate for a flip-chip package. The process can further include packaging the device in a flip-chip package using an interconnect substrate that is substantially identical to the substrate.

For testing over a broad range of temperatures, the probe tips that are further from a central point of the probe card can be made wider than the probe tips that are nearer the central point. As a result, the probe tips have sizes that depend on distances from the center point, and the probe tips can be aligned to contact the terminals on the device over a range of temperatures.

Another probing process in accordance with an embodiment of the invention uses flat or bumped contact pads on a printed circuit board for making contact to a device under test. Accordingly, fragile compliant test pins that may be cantilevered or spring loaded are not required. The process includes connecting test equipment to a printed circuit board having a set of contact pads with a pattern that matches elevated terminals on a device to be tested. The printed circuit board and the device are then brought into contact so that the elevated terminals on the device make electrical connections with the contact pads on the printed circuit board. The test equipment can then test the device via the electrical connections of the printed circuit board to the device. The printed circuit board can be substantially identical to an interconnect substrate used in a flip-chip package containing the device.

BRIEF DESCRIPTION OF THE DRAWINGS

Use of the same reference symbols in different figures indicates similar or identical items.

DETAILED DESCRIPTION

In accordance with an aspect of the invention, a wafer probing process for electrical testing of a device fabricated on a wafer also conditions the terminals on the device to improve uniformity of the heights of the terminals. The good devices when separated from the wafer are thus in better condition to provide reliable bonds to an interconnect substrate in a flip-chip package or to a circuit board when the chip is not packaged but is assembled in a "chip-on-board" application. The wafer probe can employ a probe card that is substantially identical to all or part of a printed circuit board or an interconnect substrate to which the device will be attached. Probe tips on the probe card can be the flat contact pads or bumps that are the normal electrical contact structures of the interconnect substrates. Alternatively, probe tips having a desired shape and size can be formed on the probe card to provide desired deformations of the metal bumps on the devices.

Figure 3:
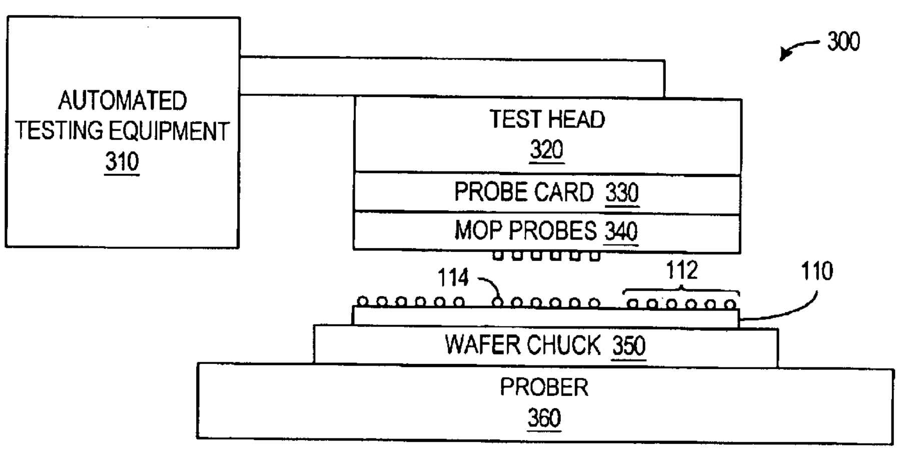
FIG. 3 illustrates wafer-probing equipment in accordance with an embodiment of the invention.

FIG. 3 is a block diagram of test equipment 300 in accordance with an exemplary embodiment of the invention. Test equipment 300 includes automatic test equipment (ATE) 310, a test head 320, a probe card 330 including metal on pad (MOP) probes 340, a wafer chuck 350, and a prober 360. Test equipment 300 electrically tests devices 112, which are fabricated on a wafer 110, and in the process also conditions terminals 114 of devices 112 to improve the planarity of terminals 114.

Devices 112 can generally be any type of device including but not limited to a memory, a controller, a processor, an application specific integrated circuit (ASIC), or any other type of integrated circuit or separate device. As terminals 114, devices 112 have metal bumps that rise above a top surface of wafer 110 by a height that is sufficient for flip-chip packaging or attachment to a printed circuit board. For current flip-chip packaging process, terminals 114 typically have an average height of between about 60 $\mu$m and about 700 $\mu$m, with 100 $\mu$m as a typical average height. Terminals 114 may, for example, be solder balls or composite structures containing multiple metal layers such as stacked solder balls, a copper or other metal pillar that is capped with a solder layer, a solder ball, gold, or a gold stud.

For a probing operation that electrically tests a selected device 112 on wafer 110, a probe card 330 having MOP probes 340 in a pattern that matches the pattern of terminals 114 on a device 112, is mounted on test head 320. MOP probes 340 can either be metal probes directly formed on probe card 330 or can include one or more a separate printed circuit board or interconnect substrate that is attached to probe card 330. Wafer 110, which is typically made of silicon (Si) or another semiconductor material, is then placed on wafer chuck 350. Prober 360 operates to position and orient wafer chuck 350 so that terminals 114 for the selected device or devices 112 are aligned with MOP probes 340. As an illustrative example, the following describes testing of one device 112 at a time, but as will be apparent to those skilled in the art, multiple devices could be simultaneously tested if desired.

With wafer 110 properly aligned, prober 360 drives chuck 350 up until terminals 114 on the selected device 112 make electrical contact with MOP probes 340 and MOP probes 340 begin to inelastically deform terminals 114. ATE 310 then applies electrical input signals through test head 320 and probe card 330 to the terminals 114 and measures the resulting output signals from the selected device 112 to determine whether the device 112 is functional and provides the required performance.

ATE 310 and prober 360 can be standard test equipment that is available commercially from a variety of suppliers including Agilent Technologies, Inc., Teradyne, Inc., and LTX Corporation. ATE 310 generally performs the electrical testing of devices 112 in a conventional manner that depends on the type of device 112. Prober 360 which controls the positioning of wafer 110 relative to MOP probes 340 is preferably capable of measuring a distance between the top surface of wafer 110 and probe card 330 or capable of precisely controlling an amount of upward movement of wafer 110 after the initial contact with probe card 330. Alternatively, probe card 330 can be moved to control the relative position of wafer 110. The ideal distance between the top surface of wafer 110 and the MOP probes 340 during testing will depend on the height of terminals 114 above the surface of wafer 110 as described further below.

In accordance with an aspect of the invention, MOP probes 340 on probe card 330 have limited compliancy to facilitate deformation of terminals 114 during probing. Probe card 330 can, for example, be a bumped or unbumped interconnect substrate that is suitable for use in a flip-chip package containing a device 112 being packaged. Such interconnect substrates are typically made of an organic material such as polyamide or other insulating material and contain conductive traces that electrically connect bumps or contact pads on one side of the interconnect substrate to a contact pads and/or a ball grid array (BGA) on an opposite side of the interconnect substrate. Alternatively, probe card 330 can be a printed circuit board or another structure on which one or more interconnect substrates are mounted. The bumps or contact pads on the interconnect substrate or substrates form MOP probes 340, which contact terminals 114 of the device 112 for electrical testing and are able to apply sufficient pressure to cause deformation of terminals 114. The BGA or other terminals on the opposite side of the interconnect substrate provide electrical connections to the test head 320.

Probe card 330 and MOP probes 340 could be one homogeneous/integrated structure or separable elements. Test heads 320 are generally standard, and a base part of probe card can be designed according to that standard and attached to test head 320. However, in the illustrated embodiment of the invention, MOP probes 340 can be on a separate substrate attached as a removable part of probe card 330. This permits use of probe card 330 with different MOP probes 340 for testing different devices. A probe card 330 with replaceable MOP probes 340 further has the advantage of permitting quick replacement of a damaged probe tips so that downtime of ATE 310 is minimized.

Probe card 330 can be rigidly mounted or spring mounted on test head 320 to provide a limited compliancy to probe card 330 as a whole. The amount of compliancy can range from 0 for a non-compliant or rigid mounting up to about 15 mils or more for a spring mounting. The desired deformation or planarization of device terminals 114 during probing, as described further below, will generally control selection of a fixed or compliant mounting, the maximum travel distance of a compliant mounting, the number of springs or other compressible structures between test head 320 and probe card 330 in a compliant mounting, and the spring constant or modulus of the compressible structures in a compliant mounting.

MOP probes 340, which can be created using printed circuit board technology, have the advantage of being easily configured to match a specific device or multiple devices for parallel testing. In contrast, a probe card having cantilevered or spring loaded probes must typically be larger than the device to accommodate the size of the probes, and arranging the probes to match one or more devices can be complicated.

Another advantage of compact and non-compliant MOP probes 340 is their durability when compared to needle, spring, or cantilever probes used in conventional probing equipment. MOP probes 340 thus maintain proper alignment without requiring adjustment and without fear of bending. MOP probes 340 can also be cleaned, for example, with a brush or other mechanical cleaning techniques without damaging or misaligning the probes.

MOP probes 340 also have relatively large flat contact areas, as described further below. The flat contact areas, beside being less likely to be damaged during use and cleaning, do not have protrusions or sharp points that pick up and hold particles. As a result, MOP probes 340 can continue to provide low contact resistance to the device under test even after prolonged use without clean.

Figure 1:
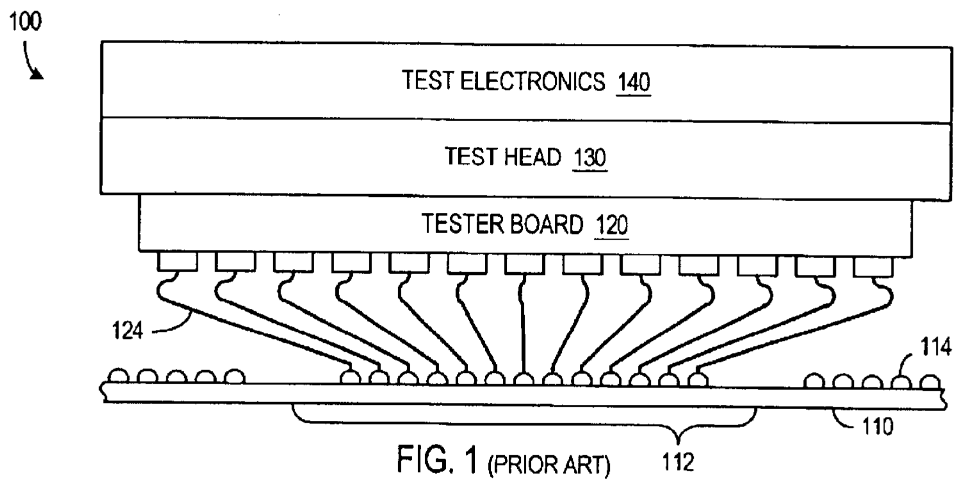
FIG. 1 shows conventional test equipment for wafer probing.
Figure 2:
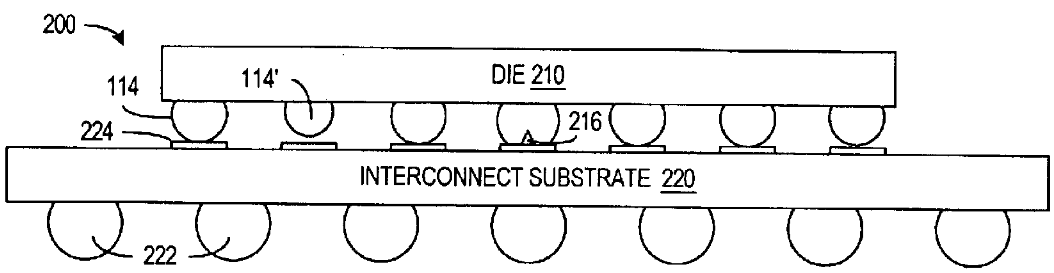
FIG. 2 shows a conventional flip-chip package containing defects that arise from testing and uneven solder bumps.
Figure 4A:
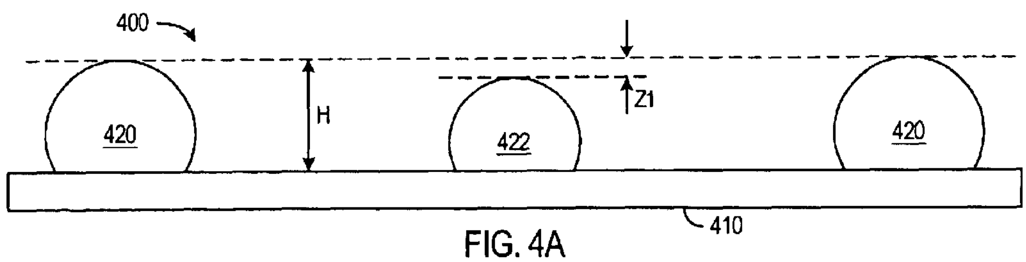
FIG. 4A shows a set of metal bump before wafer probing.

FIG. 4A illustrates a portion of a device 400 fabricated in and on a substrate 410. Device 400 includes bumps 420 and 422 that can be solder balls or other conductive structures that act as the electric terminals. Ideally, all of bumps 420 and 422 rise to the same height H above the surface of substrate 410, but bumps 420 and 422 are subject to manufacturing variations that may cause some bumps 422 to differ by a distance Z1 from the standard height H. If the distance Z1 is too large for any bump 422, a weak or defective joint will result during flip-chip bonding as described above in regard to FIG. 2.

Figure 4B:
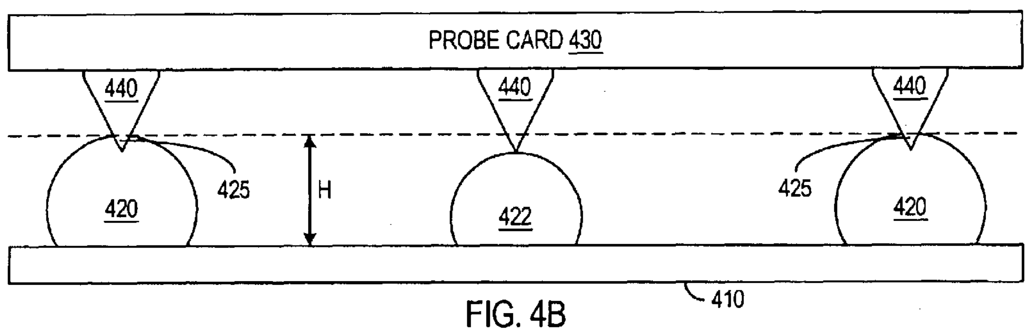
FIGS. 4B, 4C, and 4D show the metal bumps of FIG. 4A after wafer probing using illustrated probe tips in accordance with alternative embodiments of the invention.

FIG. 4B illustrates how bringing a probe card 430 having probe tips 440 that are sharp and rigid into contact with all bumps 420 and 422 on a device can gouge bumps 420. In particular, when a probe tip 440 travels a sufficient distance to electrically contact an undersized bump 422, other probe tips 440 sink into larger bumps 420, creating narrow gouges 425. Narrow gouges 425 thus formed in the larger bumps 420 can trap contaminants and weaken the electrical connections to the larger bumps 420. Additionally, the sharp probe tips 420 do little or nothing to improve the disparities in the heights of bumps 420 and 422, so that the inherent variation in the heights of bumps 420 and 422 may still result in weak or defective electrical connections in a flip-chip package.

Figure 4C:
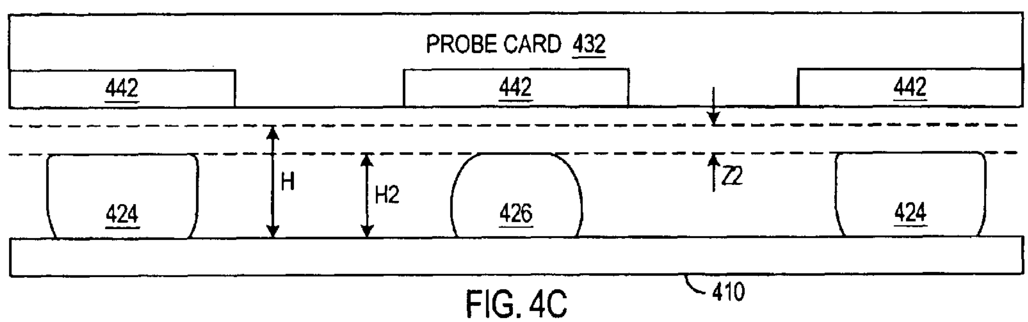

FIG. 4C illustrates a system including a probe card 432 in accordance with an embodiment of the invention having flat probe tips 442. Flat probe tips 442 preferably have a width that is at least one half of the diameter of bumps 420 and 422. In one embodiment of the invention, probe card 432 is a printed circuit board and probe tips 442 are contact pads or metal traces on a surface of the printed circuit board. Probe tip 442 should be made of a metal capable of avoiding inelastic deformation while applying the forces required for inelastic deformation of the device terminals. A material such as copper is suitable for probe tips 442 when the device terminals contain a malleable material such as a solder.

FIG. 4C shows probe tips 442 as being level with the surface of probe card 432, but alternatively probe tips 442 may rise above the surface of probe card 432 or even be recessed relative to the remainder of the surface of probe card 432. However, probe card 432 should allow the bottoms of probe tips 442 to reach the desired separation from the top of wafer 410.

For the probing operation using probe card 432, a prober first drives wafer 410 and/or probe card 432 so that the bottoms of probe tips 442 contact at least some of the corresponding bumps 420, and the top surface of wafer 410 is about distance H from the bottoms of probe tips 442. The prober then further drives wafer 410 and/or probe card 432 closer by an overtravel distance Z2. This process flattens bumps 420 that are height H or taller and bumps 422 that are at least a height H2 (H2=H−Z2). The resulting deformed bumps 424 and 426 are more uniformly of the same height H2. The tops of bumps 424 and 426 thus have better planarity than do bumps 420 and 422, and the improved planarity can enhance the interconnect joint integrity in a flip-chip package or a chip-on-board application containing the probed device.

For this embodiment of the invention, probe card 432 can be the same as the interconnect substrates (e.g., interconnect substrate 220 of FIG. 2) that will be used in the flip-chip packaging of the device after testing. Probe tips 442 then are the same as the contact pads that are soldered to bumps 424 and 426, for example, during a conventional reflow operation that electrically connects the device to the interconnect substrate of a flip-chip package.

Overtravel distance Z2 generally must at least be sufficient to provide a low contact resistance at each terminal 424 and 426 to permit electrical testing of the device. Even a small overtravel distance Z2 (e.g., the minimum overtravel required for electrical testing) generally results in a flattening of the largest of the bumps, improving the overall planarity of the bumps and therefore improving the integrity of interconnection joints in a subsequently-created flip-chip package. Larger amounts of overtravel may provide further improvements in planarity until the overtravel distance Z2 provides some flattening of all bumps 420 and 422. After the point where each of the bumps 420 and 422 is at least partially flattened, the variations in the planarity of bumps 424 and 426 depends on the variations in the planarity and the compliancy of probe tips 442.

Figure 5A:
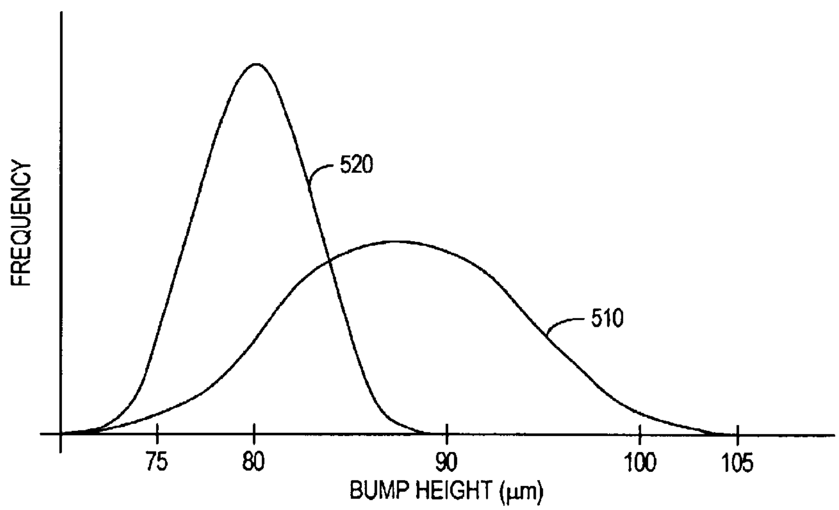
FIGS. 5A and 5B show plots illustrating the distribution of bump heights for device before and after a wafer probing process in accordance with an embodiment of the invention.

FIG. 5A shows an example of a distribution 510 of bump heights before probing and a distribution 520 of bump heights after probing. In this example, the fabrication process creates bumps that nominally have a height and width of about 90 μm, but with a variation such that a few bumps may be as tall as about 105 μm or as short as about 75 μm. The probing process, for this example, then drives the wafer and the probe card so that the average separation between the wafer and the bottoms of the probe tips is about 80 μm. When the probe card is withdrawn, the resulting distribution 520 includes bumps taller and shorter than 80 μm because of the tolerances and because the shorter terminals 422 may only undergo elastic deformations.

Figure 5B:
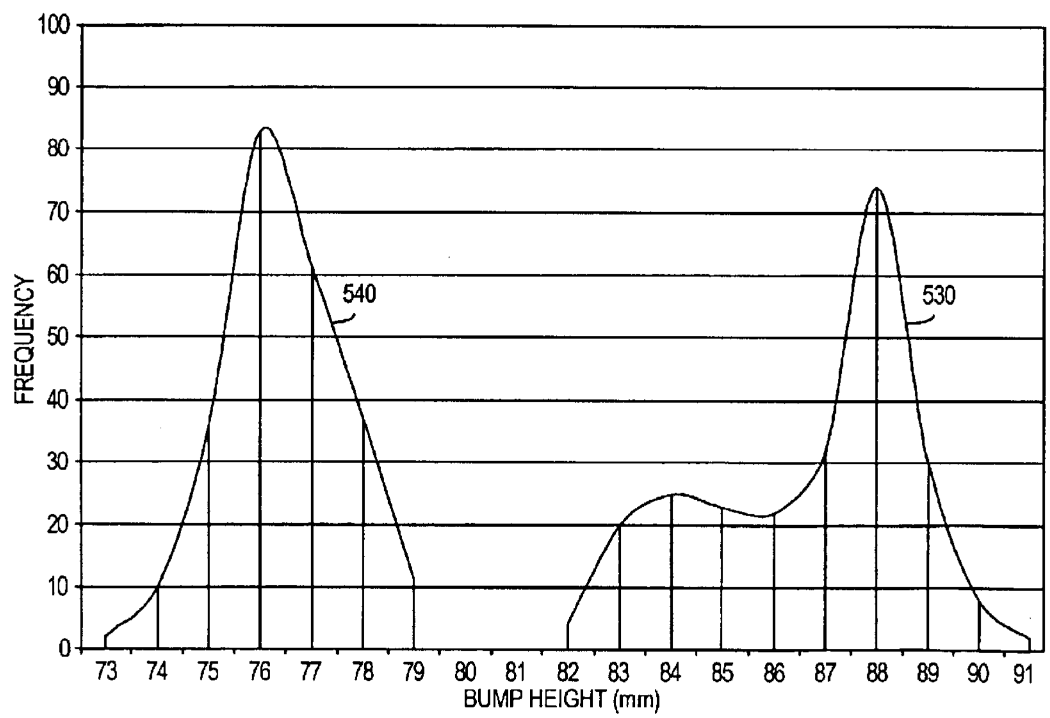

FIG. 5B shows another example distribution 530 of bump heights before probing and a resulting distribution 540 of the bump heights after probing. Before the probing operation, the bumps have an average height near 88 μm, and the shortest bump height is about 82 μm. In the example of FIG. 5B, the probing operation drives the wafer and the probe card until the average separation between the wafer and the bottoms of the probe tips is less than the shortest bump height before the probing. As a result, when the probe card is withdrawn, all of the bumps have heights that are shorter than the shortest of the bump heights in the pre-probing distribution 530. Distribution 540 thus includes shorter bump heights but is also much narrower than distribution 530, indicating that the bumps have improved planarity after probing.

The overtravel distance Z2 used during probing may need to be limited to avoid damaging the device because compression of bumps 420 and 422 can cause damaging stress on underlying portions of the device. The amount of stress introduced generally depends on overtravel distance Z2 and the structure of bumps 420. Bumps 420 and 422 made of a malleable material such as lead-based or eutectic solder can be inelastically deformed without creating stress that damages the underlying structure of a typical semiconductor device. Bumps containing a less-malleable solder and/or more rigid structures such as copper (Cu) pillars will tolerate smaller overtravel distance Z2 before the risk of damaging the underlying structure becomes too great.

Another factor in choosing an overtravel distance Z2 for the probing/planarization operation is the desired deformed profile of bumps. Overtravel distances that are larger than necessary to provide good electrical contact may provide more flattening and larger flat areas at the tops of bumps 424 and 426. For attachment of the device to an interconnect substrate, the flat areas at the tops of bumps 424 and 426 are brought into contact with the contact pads or bumps on the interconnect substrate. A reflow process then at least partially liquefies the solder, and each flattened solder bump tends to reshape itself into a spherical shape to minimize surface tension. The flattened solder balls thus naturally extend toward the interconnect wafer during the reflow process.

Figure 4D:
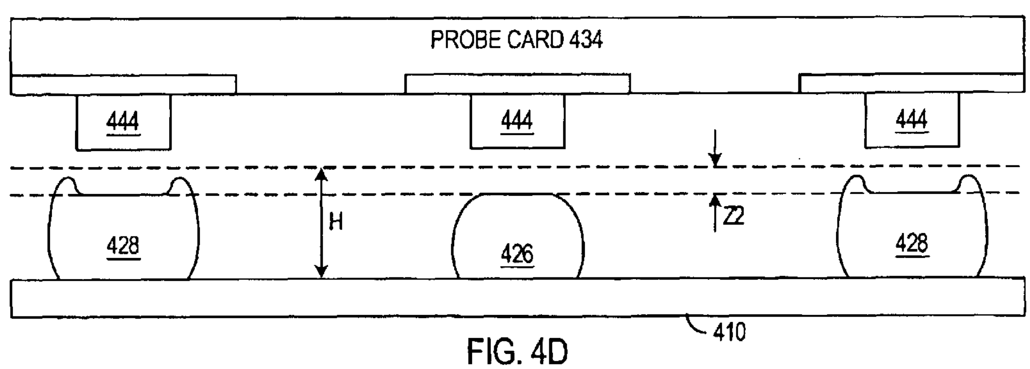

The conditioning of the tops of bumps 420 and 422 during probing is not limited to flattening the top surface of the bumps. Instead, bumps 420 and 422 can be imprinted or coined with any desired shape. FIG. 4D illustrates an example of a probe card 434 having probe tips 444 that extend above the surface of the probe card 434 and are smaller than the diameter of the bumps 420. Probe tips 444 may be, for example, about 50 μm wide while bumps 420 have diameters of about 90 μm. Such probe tips 444 may result from using a bumped interconnect substrate as probe card 434.

During the probing process, probe tips 444 create a flattened top surface on a smaller bump 426 where the flattened area of bump 426 is smaller than the area of probe tip 444. Probe tips 444 however create concave top surfaces in larger bumps 428. Such concave surfaces are acceptable when the resulting cavities are neither narrow nor deep enough to entrap contaminants such as oxidation or soldering flux. The cavities can aid in the alignment of the device with a bumped interconnect substrate during the packaging process. The integrity of the soldered connections can thus be improved through improved alignment and the natural expansion of the deformed solder balls during a reflow process.

As mentioned above in regard to test equipment 300 of FIG. 3, a probe card having probe tips in accordance with the invention can either be a single integrated structure including the probe tips or a compound structure from which a part including the probe tips can easily be removed and replaced.

Figure 6A:
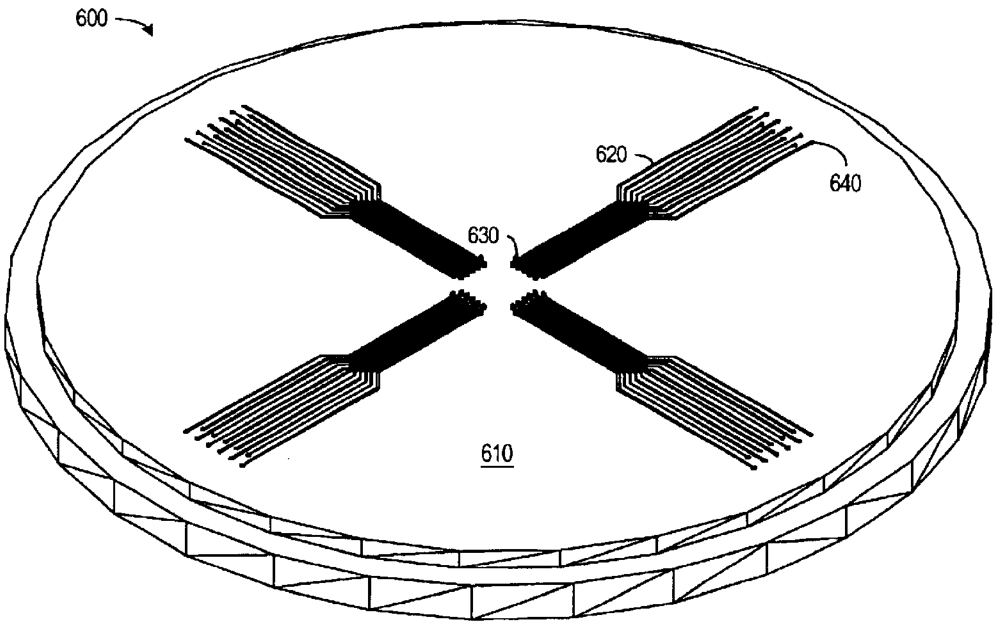
FIGS. 6A and 6B are perspective view of a probe card having integrated metal on pad probes in accordance with an embodiment of the invention.
Figure 6B:
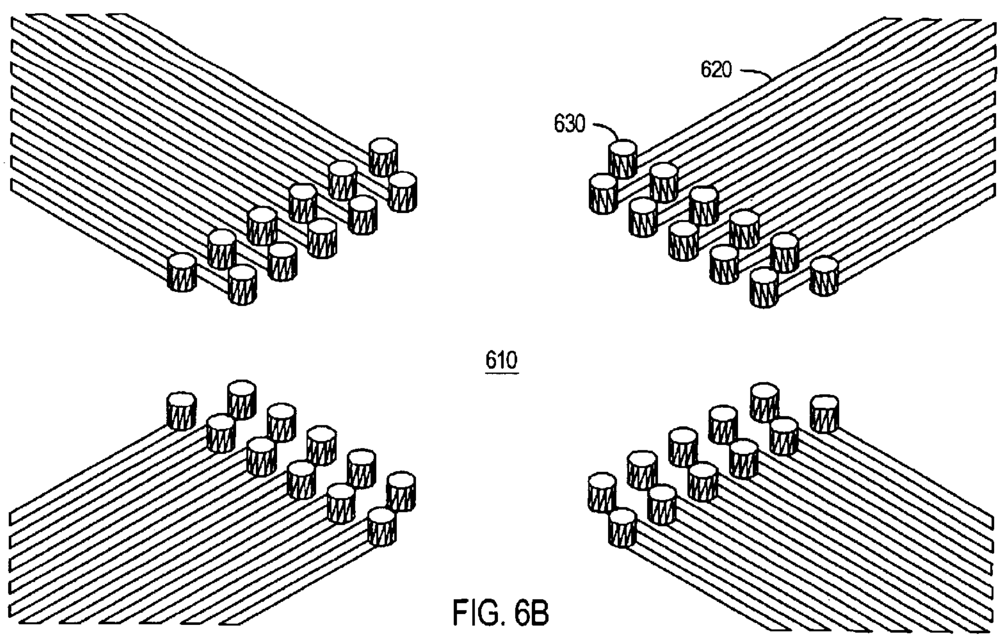

FIG. 6A shows an integrated probe card 600 in accordance with an embodiment of the invention. Probe card 600 includes a substrate 610, conductive traces 610, and probe tips 620. Substrate 610, which can be a printed circuit board, is made of an insulating material on and through which conductive traces 620 run. As illustrated, conductive traces 620 electrically connect probe tips 630 to vias 640 that lead to electrical contacts (not shown) on the side of substrate 610 that connects to a probe head. Probe tips 620, as shown in greater detail in FIG. 6B, can be carefully formed as flat-topped metal bumps on pad portions of conductive traces 620. Alternatively, the pad portions of conductive traces 610 can function as probe tips as described above. In either, case the probe tips provide flat non-compliant surfaces that can be used during wafer probing to improve the planarity of the device terminals.

An integrated probe card such as probe card 600 has an advantage in that the connections between the device being tested and the probe head (e.g., probe tips 630, conductive traces 620, and vias 640) can be optimized to provide minimum impedance, which may be important for RF circuits or high frequency testing. However, probe tips 630, being fixed to substrate 610 can only be used to test devices that have terminals in a pattern that matches the pattern of probe tips 630. The entire probe card 600 must be changed when the test equipment begins testing another type of device or if probe tips 620 are damaged.

Figure 7A:
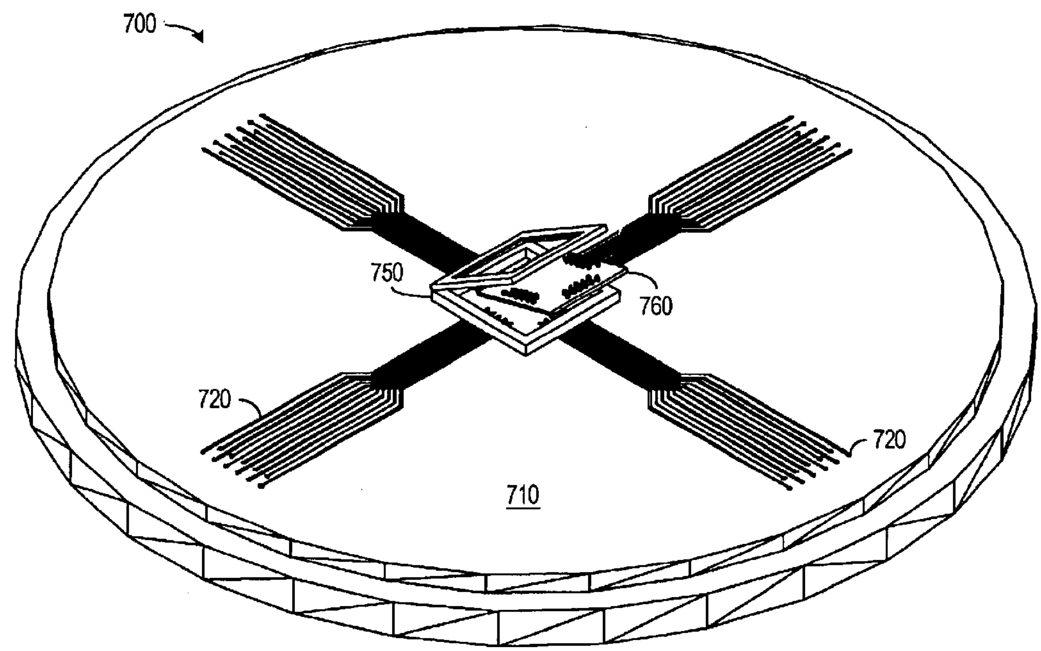
FIGS. 7A and 7B are perspective view of a probe card in accordance with an embodiment of the invention in which metal on pad probes are on a replaceable printed circuit board or interconnect substrate.

FIG. 7A shows a probe card 700 in accordance with an embodiment of the invention that facilitates rapid changes or replacement of the probe tips to minimize test equipment downtime. Probe card 700 includes a first substrate 710, a receptacle 750, and a second substrate 760. Receptacle 750 is mounted on substrate 710, and conductive traces 720 in and on substrate 710 electrically connect receptacle 750 to vias 740 leading to the electrical connections (not shown) for the test head. Substrate 760 fits in or plugs into receptacle 750 and has affixed probe tips 730. Accordingly, probe tips 730 electrically connect to the test equipment through substrate 760, receptacle 750, conductive traces 720, vias 740, and electrical contact (not shown) on the back of substrate 710.

Figure 7B:
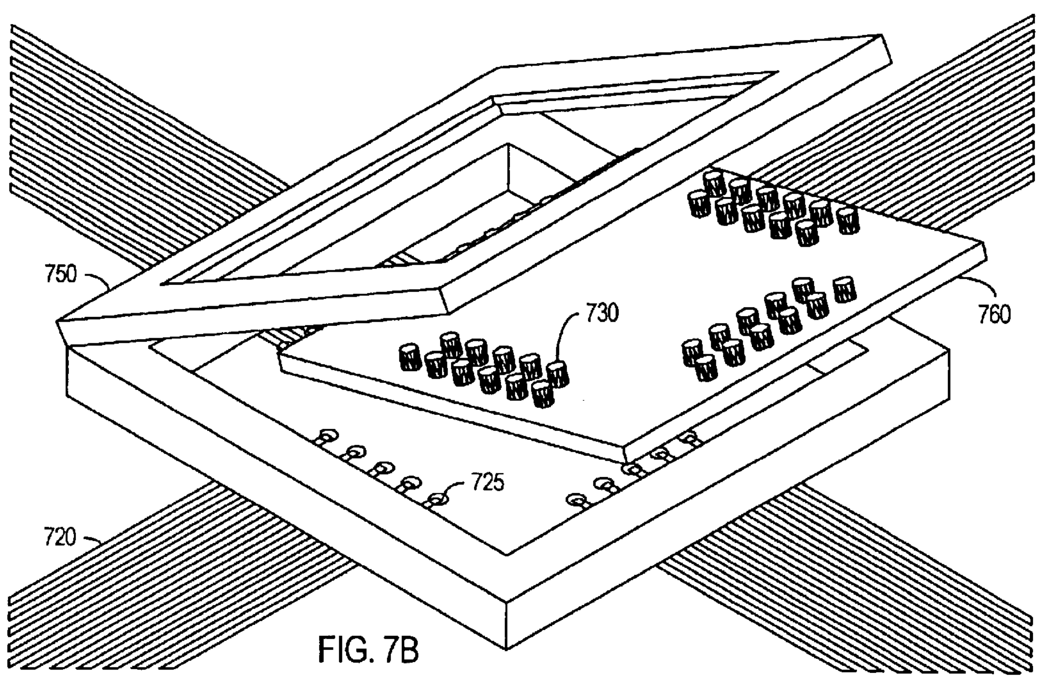

Each of substrates 710 and 760 can be made using conventional printed circuit technology, and in an exemplary embodiment of the invention, substrate 760 is identical to an interconnect substrate used in a flip-chip package for the device to be tested. Receptacle 750 can be any type of receptacle that can accommodate and provide electrical connections to substrate 760. In the illustrated embodiment of FIG. 7B, receptacle 750 includes pads 725 at the ends of conductive traces 720 that match and electrically connect to terminals (not shown) on the bottom of substrate 760. A hinged clamp then holds substrate 760 in place.

An advantage of probe card 700 is the ease with which substrate 760 can be changed while substrate 710 remains attached to the test equipment. Substrate 760 can, for example, be unclamped or unplugged and then removed from receptacle 750 without the need for unsoldering or any complicated disassembly. Substrate 760 can thus quickly be replaced with a new substrate whenever test equipment switches to testing devices having a different terminal pattern (e.g., after a die shrink) or when probe tips 730 are damaged. Such quick changes minimize the downtime of the test equipment.

Electrical probing and testing of a wafer at extreme temperatures is sometimes desired to identify and eliminate unreliable devices, to bin or categorize devices by performance or specification standards, or to qualify a device under specific operating temperatures or application conditions. An advantage of the probe card having compact probe tips instead of cantilevered or spring pins is the improved thermal stability of the probe card. A temperature change such as heating for an at-temperature test can cause a large change in the pattern of the conventional test pins because long pins expand considerably with increasing temperature. In contrast, the pattern of the probe tips thermally expands or contracts with the expansion or contraction of the relatively small interconnect substrate.

If the temperature conditions for probing are known, a probe card can be designed that will mechanically match up with the terminals of the device at the testing temperature. Such probe card design would take into account for the physical properties of the device, e.g., the coefficient of thermal expansion (CTE) of a silicon wafer, the CTE of the probe card, and the temperature of the testing. However, a probe card that matches a device at one temperature (e.g., room temperature) may not adequately match the device at a significantly different test temperature (e.g., 120° C. or higher). As a result, using the probe card at the higher temperature may provide a higher contact resistance or in the extreme case an open contact. Accordingly, a second probe card can be designed to match the device at the elevated temperature.

Figure 8A:
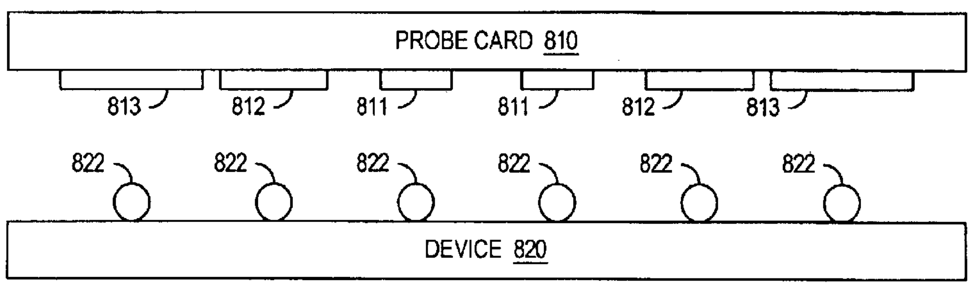
FIGS. 8A and 8B illustrate a probe card that maintains alignment with a device under test over a range of temperatures.
Figure 8B:
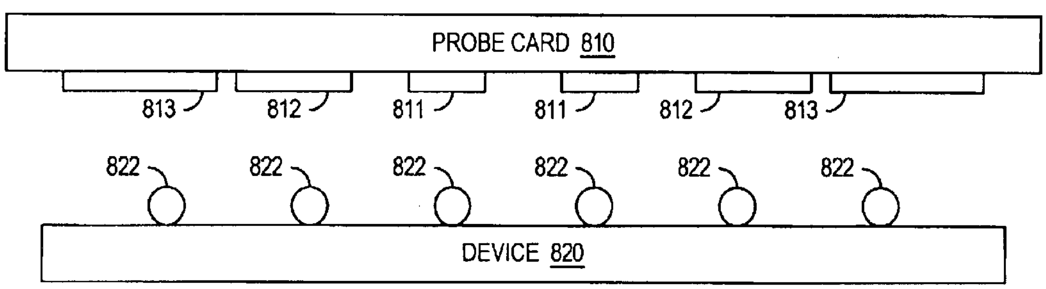

In accordance with a further aspect of the invention, the pattern and size of probe tips on one probe card can make proper contact with the terminals of a device over a wide range of temperatures. FIGS. 8A and 8B show a probe card 810 having probe tips 811, 812, and 813 that increase in size with distance from the center of probe card 810. For probing, the center of probe card 810 is aligned with the center of a device 820. FIG. 8A illustrates how terminals 822 of device 820 then align with probe tips 811, 812, and 813 at a first temperature (e.g., room temperature.) An "at-temperature" test can be performed at an elevated temperature (e.g., at 120° C.). As a result, thermal expansion of device 820 may differ from expansion of probe card 810 because of a difference in their respective coefficients of thermal expansion (e.g., a difference between the CTE of a silicon wafer and the CTE of a printed circuit board.) Normally, a differential expansion of device 820 would move each terminal 822 relative to the corresponding tip 811, 812, or 813, with the amount of movement being proportional to the distance between the terminal 822 and the center of device 820. To compensate for the differential expansion, pads 811, 812, and 813 extend over the range of positions of the corresponding terminals 822 so that pads 811, 812, and 813 remain aligned with terminals 822 even at the elevated temperature illustrated in FIG. 8B.

Although the invention has been described with reference to particular embodiments, the description is only an example of the invention's application and should not be taken as a limitation. Various adaptations and combinations of features of the embodiments disclosed are within the scope of the invention as defined by the following claims.

We claim:

1. A probing process comprising:

bringing probe tips and terminals on a device into contact;

using the probe tips to inelastically deform the terminals to improve planarity of the terminals; and electrically testing the device through electrical connections of the probe tip to the terminals.

2. The process of claim 1, wherein each probe tip has a flat contact area and flattens a corresponding one of the terminals, while simultaneously providing an electrical connection to the corresponding terminal.

3. The process of claim 2, wherein the flat contact area has a width that is at least one half of a width of one of the terminals.

4. The process of claim 1, wherein bringing the probe tips into contact with the device comprises moving a wafer containing the device relative to a substrate to which the probe tips are affixed.

5. The process of claim 4, wherein the substrate is a printed circuit board.

6. The process of claim 5, wherein the probe tips comprise bonding pads disposed on a surface of the printed circuit board.

7. The process of claim 5, wherein the probe tips comprise bumps disposed on a surface of the printed circuit board.

8. The process of claim 4, further comprising packaging the device in a flip-chip package, wherein the flip-chip package includes the device and an interconnect substrate that is substantially identical to the substrate on which the probe tips are affixed.

9. The process of claim 1, wherein the probe tips that are further from a central point have lengths that are longer than the probe tips that are nearer the central point.

10. The process of claim 1, wherein the probe tips have sizes that depend on distances from a center point so that the probe tips can be aligned to contact the terminals over a range of temperatures.

* * * * *